(12) United States Patent
Moriya et al.

(10) Patent No.: US 6,927,435 B2
(45) Date of Patent: Aug. 9, 2005

(54) SEMICONDUCTOR DEVICE AND ITS PRODUCTION PROCESS

(75) Inventors: Hiroshi Moriya, Chiyoda (JP); Tomio Iwasaki, Tsukuba (JP); Hideo Miura, Koshigaya (JP); Shuji Ikeda, Koganei (JP)

(73) Assignee: Renesas Technology Corp., Tokyo (JP)

( * ) Notice: Subject to any disclaimer, the term of this patent is extended or adjusted under 35 U.S.C. 154(b) by 97 days.

(21) Appl. No.: 10/043,099

(22) Filed: Jan. 14, 2002

(65) Prior Publication Data

US 2002/0093046 A1 Jul. 18, 2002

(30) Foreign Application Priority Data

Jan. 16, 2001 (JP) ......................................... 2001-008306
Feb. 19, 2001 (JP) ......................................... 2001-041097

(51) Int. Cl.[7] ..................... H01L 29/76; H01L 27/108; H01L 21/336
(52) U.S. Cl. ..................... 257/295; 257/310; 438/240; 438/253; 438/258; 438/260
(58) Field of Search .................. 257/310, 295; 438/393, 240, 253, 250

(56) References Cited

U.S. PATENT DOCUMENTS

| | | | |
|---|---|---|---|
| 4,200,474 A | | 4/1980 | Morris |
| 4,769,686 A | * | 9/1988 | Horiuchi et al. ............. 257/373 |
| 4,931,851 A | * | 6/1990 | Sibbald et al. ............... 257/414 |
| 4,937,650 A | * | 6/1990 | Shinriki et al. ............. 257/296 |
| 5,079,191 A | * | 1/1992 | Shinriki et al. ..... 148/DIG. 116 |
| 5,371,026 A | * | 12/1994 | Hayden et al. ............. 438/275 |
| 5,582,640 A | * | 12/1996 | Okada et al. ................... 117/8 |
| 5,646,058 A | * | 7/1997 | Taur et al. ........... 257/E29.275 |
| 5,716,861 A | * | 2/1998 | Moslehi ............... 257/E29.135 |
| 5,753,884 A | * | 5/1998 | Hilgenfeldt et al. ..... 219/117.1 |
| 5,879,447 A | * | 3/1999 | Okada et al. ................... 117/8 |
| 5,952,700 A | * | 9/1999 | Yoon ........................... 257/405 |
| 5,998,290 A | * | 12/1999 | Wu et al. ............. 257/E29.152 |
| 6,004,837 A | * | 12/1999 | Gambino et al. ........... 438/157 |
| 6,020,024 A | * | 2/2000 | Maiti et al. ............. 257/E29.16 |
| 6,037,627 A | * | 3/2000 | Kitamura et al. ........... 257/324 |
| 6,093,243 A | * | 7/2000 | Okada et al. ................... 117/8 |
| 6,093,944 A | * | 7/2000 | VanDover .................... 257/310 |
| 6,150,201 A | * | 11/2000 | Dennison et al. .... 257/E29.277 |
| 6,166,412 A | * | 12/2000 | Kim et al. .................... 257/247 |
| 6,200,843 B1 | * | 3/2001 | Bryant et al. ................ 438/216 |
| 6,281,084 B1 | * | 8/2001 | Akatsu et al. ............... 438/301 |
| 6,297,107 B1 | * | 10/2001 | Paton et al. ................. 438/197 |
| 6,372,559 B1 | * | 4/2002 | Crowder et al. ............. 438/156 |
| 6,372,618 B2 | * | 4/2002 | Forbes et al. ................ 438/589 |
| 6,429,088 B1 | * | 8/2002 | Lau ............................. 438/240 |
| 6,451,641 B1 | * | 9/2002 | Halliyal et al. ............. 438/200 |

FOREIGN PATENT DOCUMENTS

| | | | |
|---|---|---|---|
| JP | 53010283 A | * | 1/1978 |
| JP | 3074878 | | 3/1991 |

OTHER PUBLICATIONS

Takagi, et al., "A New I–V Model for Stress–Induced Leakage Current Including Inelastic Tunneling", IEEE Transactions on Electron Devices, vol. 46, No. 2, Feb. 1999, pp. 348–354.

Campbell, et al., "Titanium dioxide ($TiO_2$)–based gate insulators", IBM J. Res. Develop. vol. 43, No. 3, May 1999, pp. 383–392.

* cited by examiner

Primary Examiner—Long Pham
Assistant Examiner—Shrinivas H. Rao
(74) Attorney, Agent, or Firm—Antonelli, Terry, Stout & Kraus, LLP

(57) ABSTRACT

A semiconductor device comprising a semiconductor substrate, gate insulators formed on the substrate, and gate electrodes formed on the gate insulators, the gate insulators which are mainly composed of a material selected from titanium oxide, zirconium oxide and hafnium oxide, and in which compressive strain is produced and equipped with MOS transistors, can suppress leakage current flowing through the gate insulators and has high reliability.

26 Claims, 14 Drawing Sheets

SEMICONDUCTOR DEVICE AND ITS PRODUCTION PROCESS

BACKGROUND OF THE INVENTION

The present invention relates to a semiconductor device, particularly to a semiconductor device equipped with MOS transistors.

Silicon oxide is a material having excellent insulating properties, featuring a bandgap of as large as 8.0 eV. Thanks to its high insulating performance, this material has been dominantly used for insulating films such as gate insulators and layer insulators in semiconductor devices.

In recent years, however, with miniaturization of semiconductor devices, thinning of the gate insulators has become an essential requirement, and oxide films with a thickness of less than 3.0 nm have come to be used as such insulators. Decrease of insulating film thickness to less than 3.0 nm entails an inegligibly high rise of tunneling current, causing a corresponding increase of leakage current and power consumption.

It is known that tunneling current can be classified roughly into two types: Fowler-Nordheim tunneling current (FN current) and direct tunneling current (DT current). FN current is a current which is caused to flow as the electrons tunnel the triangular potential produced as a result of distortion of the energy barrier by an external electric field. DT current is a current which is caused to flow by tunneling of the electrons directly through the oxide films.

It has been disclosed that ideally FN current and DT current can be defined by using the WKB (Wentzel-Kramers-Brillouin) approximation according to, for example, the equation (A1) on page 354 of IEEE TRANSACTIONS ON ELECTRON DEVICE, Vol. 46, No. 2, making use of energy barrier $\Phi_B$ between electrode and insulating film.

Rise of tunneling current by the thinning of silicon oxide gate insulators is primarily attributable to the increase of DT current. There is a concern that when various types of high-permittivity material are used for the gate insulators, the leakage current density may elevate sharply depending on the producing method of gate electrodes or gate insulators.

SUMMARY OF THE INVENTION

An object of the present invention is to provide a semiconductor device equipped with MOS transistors having high-permittivity gate insulators, in which the leakage current flowing through the gate insulators is restrained.

Another object of the present invention is to provide a semiconductor device which can be driven at high speed with low power consumption.

The present invention provides a semiconductor device comprising a semiconductor substrate, gate insulators formed on said substrate, and gate electrodes formed on said gate insulators, said gate insulators which are primarily composed of titanium oxide, zirconium oxide, hafnium oxide or titanium oxide having a rutile type crystal structure, and in which compression strain is produced, and said semiconductor device equipped with MOS transistors.

The present invention also provides a semiconductor device equipped with MOS transistors having titanium oxide gate insulators disposed between the semiconductor substrate and gate electrodes, wherein the main crystal structure of said titanium oxide is anatase type, and the strain produced in the channel region of said semiconductor substrate is tensile strain.

DETAILED DESCRIPTION OF THE INVENTION

Figure 1:
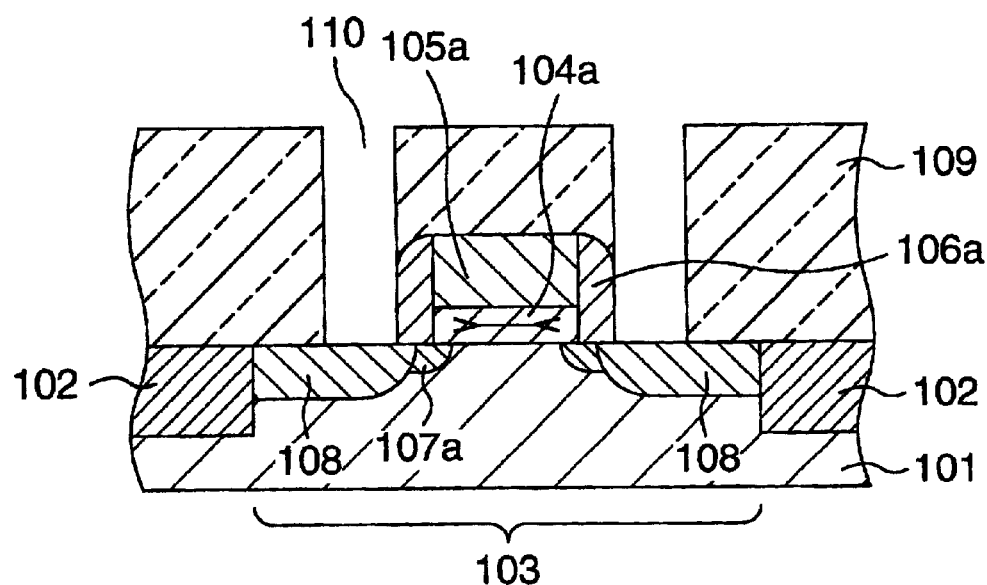
FIG. 1 is a schematic sectional view showing the principal part of the semiconductor device according to Example 1 of the present invention, which view was taken along the line A–A' of FIG. 2.

The rise of tunneling current incidental to thinning of the silicon oxide gate insulators is mostly attributable to the increase of DT current. So, it is suggested to restrain the increase of DT current by thickening the gate insulators while maintaining the dielectric properties by using titanium oxide, zirconium oxide or hafnium oxide having higher permittivity than silicon oxide for the gate insulators. For example, supposing that the permittivities of titanium oxide and silicon oxide are 60 and 4.0, respectively, the titanium oxide film of 30 nm thick will have the dielectric properties equivalent to a 2 nm thick silicon oxide film. Thus, the said titanium oxide film of 30 nm thick is called to have a silicon oxide reduced thickness of 2 nm. The actual film thickness 30 nm is called physical thickness.

In use of said high-permittivity materials for the gate insulators, there has been a problem of possible exponential increase of leakage current density depending on the method of producing the gate electrodes or gate insulators.

The present inventors have pursued studies for solving the above problem and, as a result, disclosed the mechanism that causes an exponential increase of the density of the leakage current flowing through the gate insulators depending on the method of producing the gate electrodes or gate insulators, and its countermeasure devised by the present inventors was embodied as the present invention.

This mechanism is summarized as follows. Depending on the method of forming the gate electrodes or gate insulators, the formed high-permittivity film assumes a state of tensile strain, causing a reduction of the high-permittivity film bandgap while raising the tunneling probability to increase leakage current. In order to solve these problems, the semiconductor device of the present invention, in one embodiment thereof, comprises a semiconductor substrate, gate insulators formed on this substrate and gate electrodes formed on said insulators, said gate insulators which are primarily composed of a material selected from titanium oxide, zirconium oxide and hafnium oxide and in which compression (or compressive) strain is produced, and said semiconductor device equipped with MOS transistors.

The semiconductor device of the present invention according to another embodiment thereof comprises a semiconductor substrate, gate insulators formed on said substrate, and gate electrodes formed on said insulators, said gate insulators which are mainly composed of titanium oxide having a rutile type crystal structure and in which compression strain is produced, and said semiconductor device equipped with MOS transistors.

The semiconductor device of the present invention according to still another embodiment thereof comprises a semiconductor substrate, gate insulators formed on said substrate and gate electrodes formed on said insulators, said gate insulators which are primarily composed of titanium oxide having a rutile type crystal structure and in which compression strain is produced, and said semiconductor device equipped with MOS transistors in which the main composing material of said gate electrodes has a greater thermal expansion coefficient than said titanium oxide.

The semiconductor device according to yet another embodiment of the present invention comprises a semiconductor substrate, gate insulators formed on said substrate and gate electrodes formed on said insulators, said gate insulators which are primarily composed of titanium oxide having a rutile type crystal structure and in which compression strain is produced, and said semiconductor device equipped with MOS transistors.

In said semiconductor devices according to the present invention, each said insulator comprises a film mainly composed of silicon oxide and an overlying film composed of a material selected from titanium oxide, zirconium oxide and hafnium oxide.

The method for producing the semiconductor device according to the present invention comprises the step of forming gate insulators mainly composed of titanium oxide having a rutile type crystal structure by depositing it on one principal surface of the semiconductor substrate, and the step of forming gate electrode films on said gate insulators.

Another embodiment of the semiconductor device producing method according to the present invention comprises the step of forming gate insulators mainly composed of titanium oxide by depositing it on one principal surface of the semiconductor substrate by CVD at a temperature of 650° C. or above, and the step of forming gate electrode films on said gate insulators.

In still another embodiment of the semiconductor device producing method according to the present invention, the said gate insulator forming step comprises the step of forming a film mainly composed of silicon oxide, and a step of forming on this silicon oxide film a film mainly composed of an oxide material having higher permittivity than said silicon oxide. Said high-permittivity oxide is mainly composed of a material selected from titanium oxide, zirconium oxide and hafnium oxide.

The semiconductor device according to yet another embodiment of the present invention comprises a semiconductor substrate and MOS transistors formed on said substrate and having gate insulators and gate electrodes formed thereon, wherein a first MOS transistor has a gate insulator mainly composed of a material selected from titanium oxide, zirconium oxide and hafnium oxide, and a second MOS transistor has a gate insulator with a high content of silicon oxide. It is preferable that the gate insulator of the second MOS transistor is mainly composed of silicon oxide.

In said semiconductor device, said first MOS transistor may be a transistor used for the calculators or memories, and said second MOS transistor may be a transistor used for I/O.

It is preferable that each of said MOS transistors comprises a MOS transistor having a gate insulator mainly composed of silicon oxide, and a gate insulator mainly composed of a high-permittivity material having a relative dielectric constant of 16 or more.

The semiconductor device according to still another embodiment of the present invention comprises a semiconductor substrate, gate insulators formed on said substrate, and gate electrodes formed on said gate insulators, said gate insulators which have a multilayer structure mainly composed of a material selected from titanium oxide, zirconium oxide and hafnium oxide and in which compression strain is produced, and said semiconductor device equipped with MOS transistors.

In the semiconductor device according to the present invention, the gate insulator is composed of titanium oxide, zirconium oxide, hafnium oxide, tantalum oxide, or a laminate thereof, and the state of strain in the gate insulator is mostly compression strain, so that it is possible to prevent the reduction of bandgap and to thereby minimize the tunneling current.

Further, by incorporating a structure in which the leakage current is hard to flow, it is possible to provide a semiconductor device with high reliability or a high yield rate.

It is known that titnaium oxide takes two types of crystal structure, rutile and anatase, depending on its production method. For example, in Table 1 on page 385 of IMB Journal of Research and Development, Vol. 43, No. 3, it is shown that, as determined by CVD (chemical vapor deposition) method, titanium oxide takes the anatase phase at deposition temperature of 465° C. or below, an anatase and rutile mixed structure at 550° C. and 620° C., and the rutile phase at 660° C. or above. It is also disclosed that annealing shifts anatase type titanium oxide into rutile type. Thus, use of rutile type titanium oxide for the conventional gate insulators is proposed because of better thermal stability of rutile type titanium oxide than that of anatase type.

In the conventional semiconductor devices, however, if it is tried to satisfy both requirements for high speed and low power consumption, tensile strain is produced in the channel layer, and further, it is necessary to take a structure in which rutile type titanium oxide is used for the gate insulator. In such a structure, since the channel layer is placed under tensile strain, the leakage current flowing in the gate insulators increases, consequently causing a hike of power consumption.

Studies on this matter by the present inventors led to the elucidation of the mechanism of increasing the density of leakage current flowing in the rutile type titanium oxide gate insulators as a result of impartation of tensile strain to the channel layer. That is, according to the disclosed mechanism, as tensile strain is given to the channel layer, there is also produced tensile strain in the rutile type titanium oxide gate insulators, causing a decrease of the bandgap of the rutile type titanium oxide film while raising the tunneling probability, resulting in increased leakage current.

So, the present invention further provides a high-speed and power-saving semiconductor device. This semiconductor device incorporates MOS transistors having titanium oxide gate insulators interposed between the semiconductor substrate and gate electrodes, wherein the main crystal structure of said titanium oxide is anatase type, and tensile strain is given to the channel region of said semiconductor substrate.

By adopting anatase type for the main crystal structure of the titanium oxide gate insulators, it is possible to make the gate insulator bandgap greater than when rutile type is used. Also, even if tensile strain is exerted to the gate insulators, since the bandgap in the antase type is greater than that in the rutile type, it is possible to prevent the rise of tunneling current which would be caused by tensile strain, allowing a reduction of leakage current and realizing high-speed and low-power-consumption drive of the semiconductor device.

In the above embodiments, preferably a silicon oxide film or a titanium silicate film is disposed between the semiconductor substrate and the titanium oxide gate insulator.

Also, in either of the above embodiments, preferably the gate electrodes have a phosphorus- or boron-incorporated polycrystalline silicone film, and a silicon oxide or titanium silicate film is placed between the gate electrodes and the titanium oxide gate insulators.

Further, in either of the above embodiments, preferably the gate electrodes comprise a tungsten film, molybdenum film, tungsten nitride film, tungsten boride film, tungsten silicide film or a laminate thereof.

Still further, in either of the above embodiments, preferably the gate electrodes comprise a ruthenium oxide film which is in contact with the said titanium oxide insulating film.

In the MOS transistors mentioned above, the electrodes may not necessarily be made of metals; they may be made of polycrystalline silicon or other suitable material. These MOS transistors can be used similarly to the conventional field effect transistors.

Now, the embodiments of the present invention are described in detail with reference to FIGS. 1 to 14 of the accompanying drawings.

EXAMPLE 1

Figure 2:
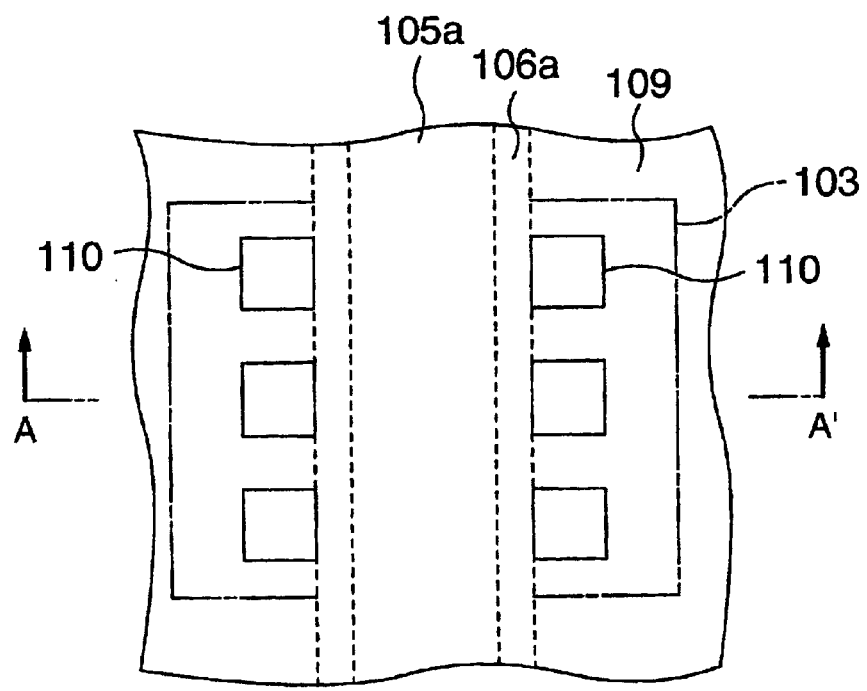
FIG. 2 is a top plan view of the principal part of the semiconductor device according to Example 1 of the present invention.

FIG. 1 is a schematic sectional view showing the structure of the principal part of the semiconductor device according to the first embodiment (Example 1) of the present invention, which view was taken along the line A–A' of FIG. 2 which shows a planar layout of the device. In the semiconductor device in this embodiment, as illustrated in FIG. 1, an element separating film 102 made of, for example, silicon oxide is provided on the surface of a P-type silicon substrate 101 to form an element forming region or domain 103. N-channel MOS transistors are provided in said element forming region 103.

Each MOS transistor has a gate insulator 104*a* and a gate electrode 105*a* and is flanked by a side wall 106*a* made of, for instance, silicon nitride. Gate insulator 104*a* is mainly composed of titanium oxide having a rutile type crystal structure, and gate electrode 105*a* comprises, for example, a polycrystalline silicon film, a thin metal film, a metal silicide film or a laminate thereof.

Each MOS transistor also has an $N^-$ type source/drain diffusion layer 107*a* formed as self-aligned to the gate electrode 105 and an $N^+$ type source/drain diffusion layer 108 formed as self-aligned to the element separating layer 102 and gate electrode 105*a*.

On the surface of this semiconductor device is provided a layer insulating film 109 in which are formed contact holes 110 which reach the $N^+$ type source/drain diffusion layer 108.

Supposing that the thickness of the rutile type titanium oxide gate insulator is 30 nm and the permittivities of rutile type titanium oxide and silicon oxide are 60 and 4.0, respectively, then the silicon oxide reduced thickness of the insulator is 2 nm, provided that they have the same dielectric properties. That is, the said rutile type titanium oxide gate insulator has a physical thickness of 30 nm and a reduced thickness of 2 nm.

The state of strain of the said gate insulator 104*a* made of titanium oxide is compressive.

Thus, in the semiconductor device of the present invention, since the gate insulator 104*a* is composed of rutile type titanium oxide which is a high-permittivity material, it is possible to make the physical thickness of said insulators greater than when silicon oxide is used, thereby preventing DT current from flowing.

The bandgap of the gate insulator becomes greater than when no strain exists or when tensile strain is formed. The enlarged bandgap reduces the probability of electrons to pass through the insulator, thus holding back the rise of leakage current. Also, because of use of rutile type titanium oxide, there can be obtained a gate insulator which is thermally more stable than when anatase type titanium oxide is used.

Figure 3:
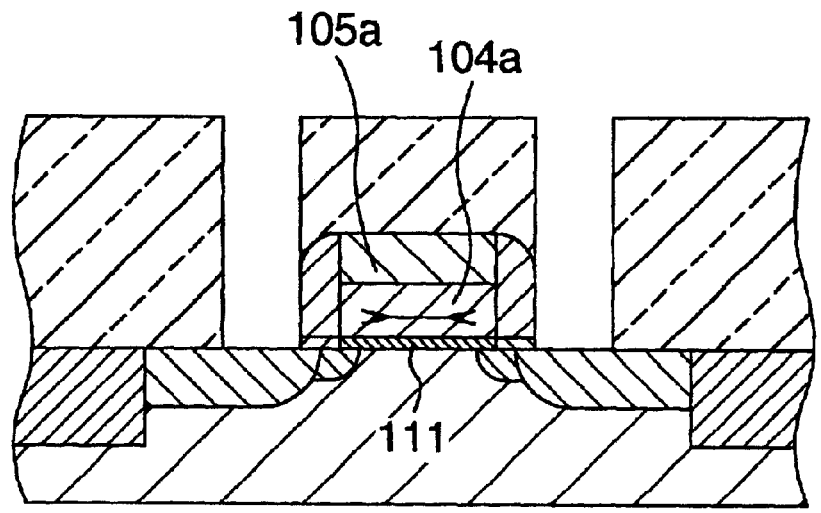
FIG. 3 is a schematic sectional view of the principal part of the semiconductor device according to Example 1 of the present invention.

Further, as shown in FIG. 3, a single layer or more layers of insulator 111 made of silicon oxide, silicon nitride, silicon oxide nitride or the like may be formed between the silicon substrate 101 and the gate insulator 104a. In this case, however, the thickness of such an insulator is preferably not greater than 0.5 nm for obtaining high permittivity of the gate insulator.

Figure 4:
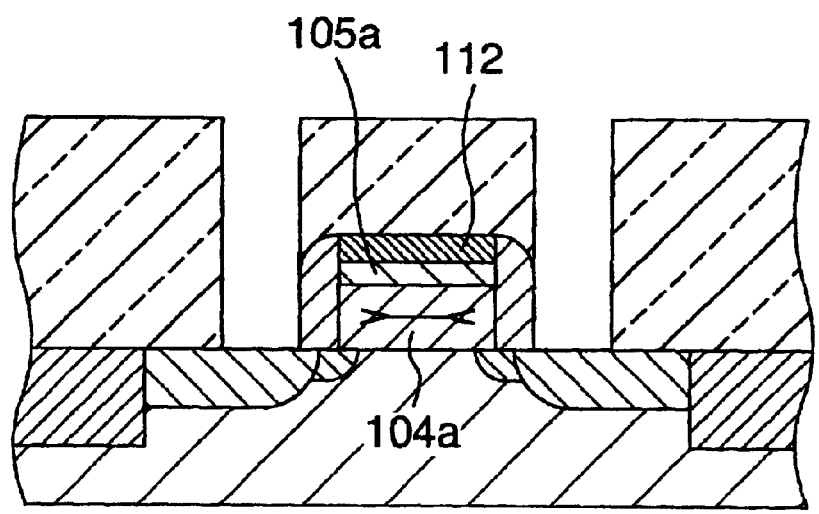
FIG. 4 is also a schematic sectional view of the principal part of the semiconductor device according to Example 1 of the present invention.

The gate electrode may be formed in two or more layers (e.g. 105a and 112) as shown in FIG. 4.

The foregoing explanation concerns the embodiments where titanium oxide was used for the gate insulators, but the similar effect can be obtained by using zirconium oxide or hafnium oxide.

Figure 5:
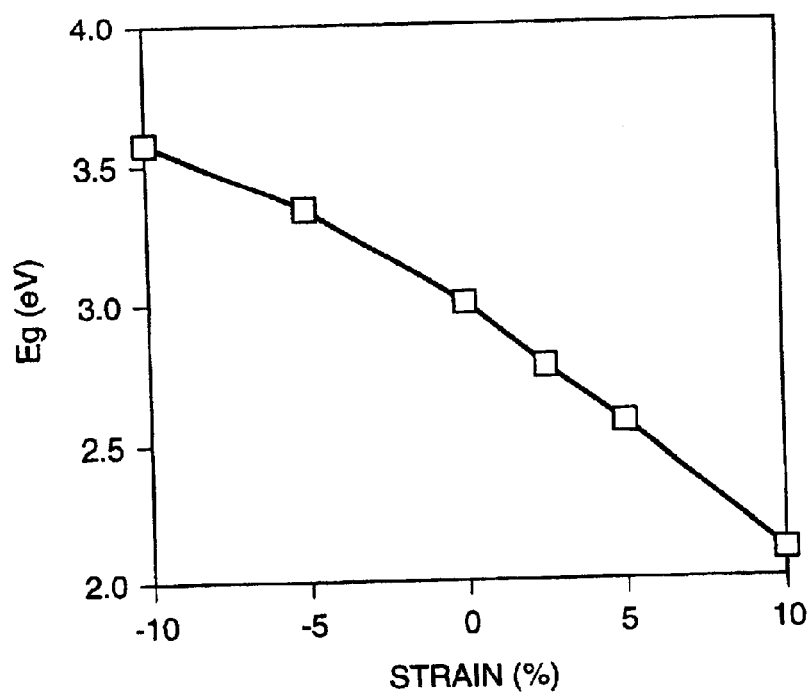
FIG. 5 is a graph showing strain dependence of the bandgap of rutile type titanium oxide in Example 2 of the present invention.

FIG. 5 depicts strain dependence of the bandgap of rutile type titanium oxide. Here, positive strain represents tensile strain and negative strain represents compressive strain. It is seen from FIG. 5 that the bandgap of rutile type titanium oxide decreases with rise of tensile strain while increases with rise of compressive strain.

Strain dependence of the bandgap shown in FIG. 5 was determined from the first-principles band calculations. This first-principles band calculations are a method in which, as explained for instance in Iwanami Koza Modern Physics 7 "Solids—Structure and Physical Properties" (Iwanami Shoten, 1994), the Schrödinger's equation relating to the electrons in a solid is solved and the energy band of the electrons is calculated.

The "bandgap" is the energy difference between the upper edge of the energy level (valence electron band) occupied by the electrons and the lower edge of the energy level (conduction band) not occupied by the electrons. The greater the bandgap, the higher becomes the permittivity, hence the more restrained is the current flow. According to the density functional theory, the calculated value of the bandgap is usually underestimated in comparison with the experimental values. In our calculations, therefore, the calculated values of bandgap were corrected according to the experimental results.

Figure 6:
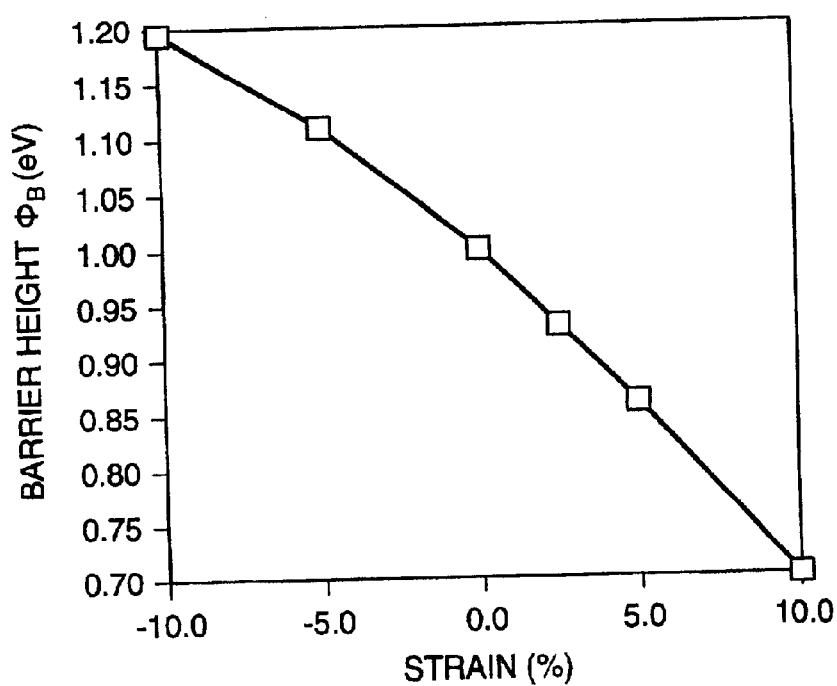
FIG. 6 is a graph showing strain dependence of the barrier height of rutile type titanium oxide in Example 2 of the present invention.

FIG. 6 shows strain dependence of the barrier height of rutile type titanium oxide. Here, positive strain represents tensile strain and negative strain represents compressive strain. Assuming that the barrier height $\Phi_B(\epsilon)$ is proportional to the bandgap $Eg(\epsilon)$ shown in FIG. 5, it was calculated from the following equation (1):

$$\Phi_B^R(\epsilon) = \Phi_B^R(\epsilon=0) \times Eg(\epsilon)/Eg(\epsilon=0) \quad (1)$$

$\Phi_B^R(\epsilon=0)$ is the barrier height when there exists no strain ($\epsilon$), and it was here supposed to be 1.0 eV. The obtained value is the barrier height of rutile type titanium oxide of the bulk which has been obtained in the experiment.

It is seen from FIG. 6 that the barrier height of rutile type titanium oxide decreases with the rise of tensile strain but increases with the rise of compressive strain.

It is preferable to use the following equation (1') in place of the equation (1) for making calculations with higher precision.

$$\Phi_B^R(\epsilon) = \frac{1}{2}(E_g^R(\epsilon) - E_g^{S1}) \quad (1')$$

$E_g^{S1}$: bandgap of silicon,=1.1 eV

Figure 7:
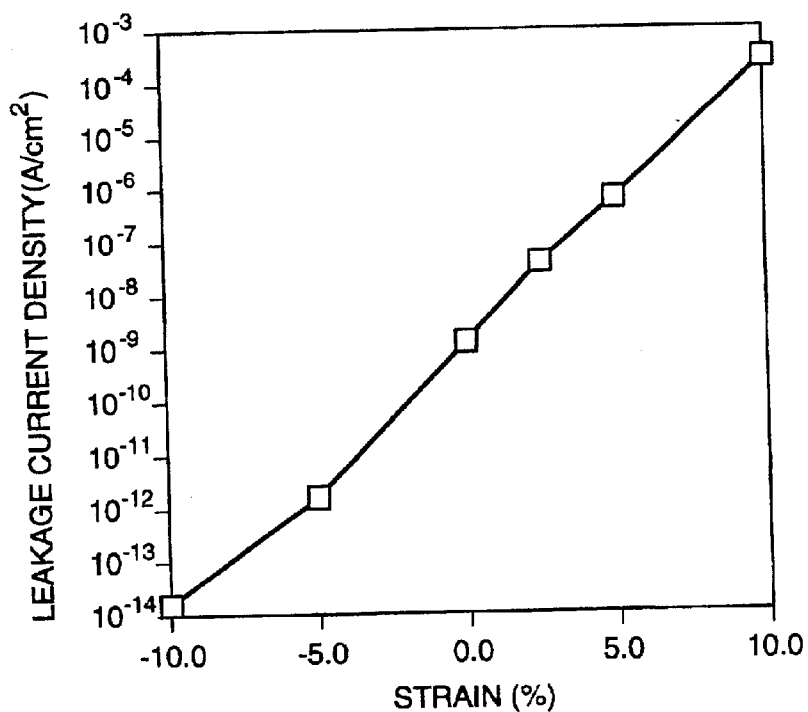
FIG. 7 is a graph showing strain dependence of leakage current of the rutile type titanium oxide gate insulator in Example 2 of the present invention.

FIG. 7 depicts strain dependence of the leakage current of rutile type titanium oxide. (Silicon dioxide reduced thickness of rutile type titanium oxide=2.0 nm; applied voltage=1 V). Strain dependence of the leakage current density shown in FIG. 7 was determined from the relation between the probability of the electrons to tunnel the insulating film and the strain by using the WKB approximation, as explained in, for instance, IEEE TRANSACTIONS ON ELECTRON DEVICES, Vol. 46, No. 2, page 354, by referring to strain dependence of the barrier height depicted in FIG. 6. The result shown in FIG. 7 is the one obtained when the applied voltage was 1 V and the silicon oxide reduced film thickness was 2 nm. The silicon oxide reduced thickness on the horizontal axis in FIG. 7 is the film thickness with which the same dielectric properties as silicon oxide can be obtained, and when it is assumed that the permittivities of silicon oxide and rutile type titanium oxide are 4.0 and 60, respectively, the thickness of the titanium oxide film whose silicon oxide reduced thickness is 2.0 nm comes to 2.0 nm×60/4.0=30.0 nm. It can be learned from FIG. 7 that the leakage current density in rutile type titanium oxide rises with the increase of tensile strain and drops with the increase of compressive strain.

EXAMPLE 2

Figure 8:
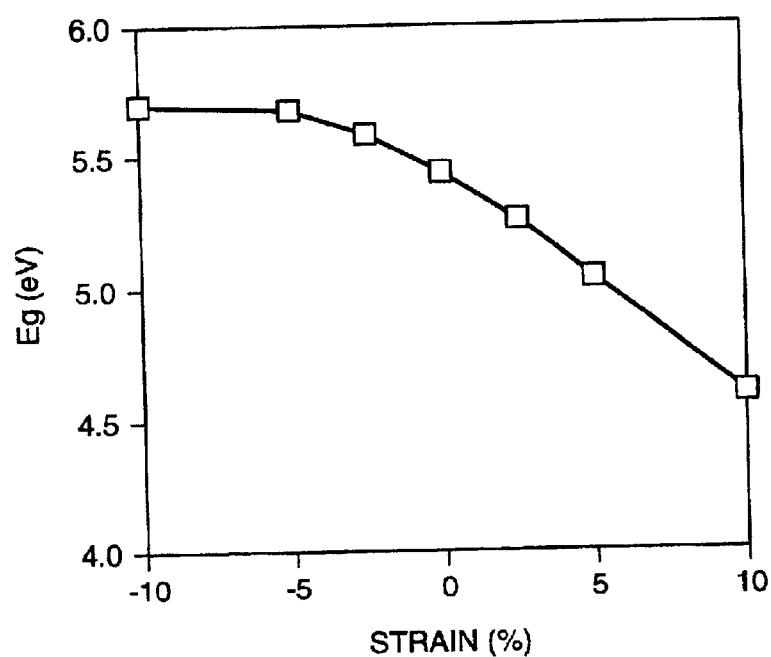
FIG. 8 is a graph showing strain dependence of the bandgap of zirconium oxide in Example 2 of the present invention.
Figure 9:
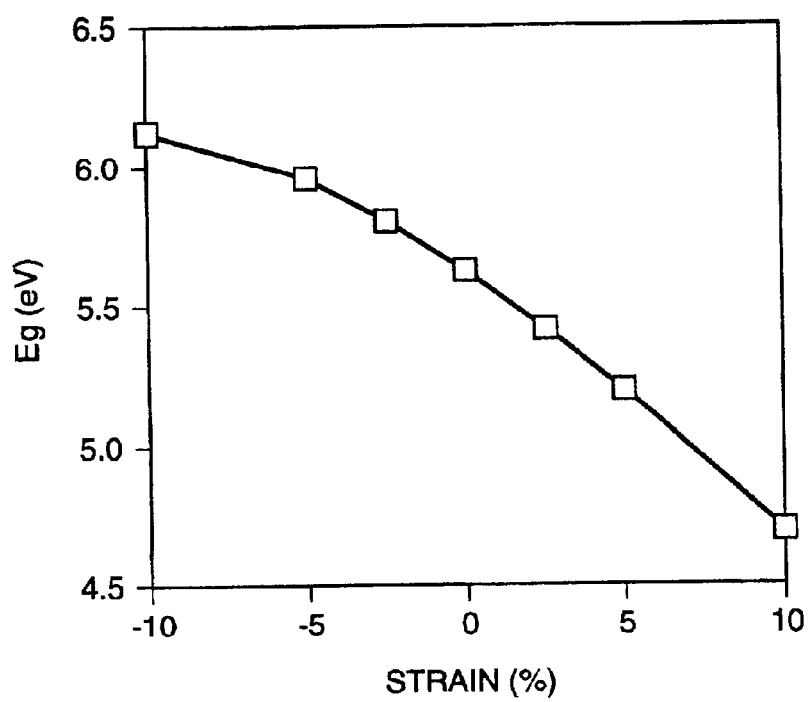
FIG. 9 is a graph showing strain dependence of the bandgap of hafnium oxide in Example 2 of the present invention.

For the explanation of the second embodiment of the present invention, reference is made to FIGS. 8 and 9 which show strain dependence of the bandgap of hafnium oxide. It is noted from FIGS. 8 and 9 that the bandgap of either of zirconium oxide and hafnium oxide decreases with the increase of tensile strain and increases with the increase of compressive strain. It is recognized from this that the leakage current density in the case of zirconium oxide or hafnium oxide, as in the case of rutile type titanium oxide described above, rises with the increase of tensile strain and drops with the increase of compressive strain.

EXAMPLE 3

Figure 10:
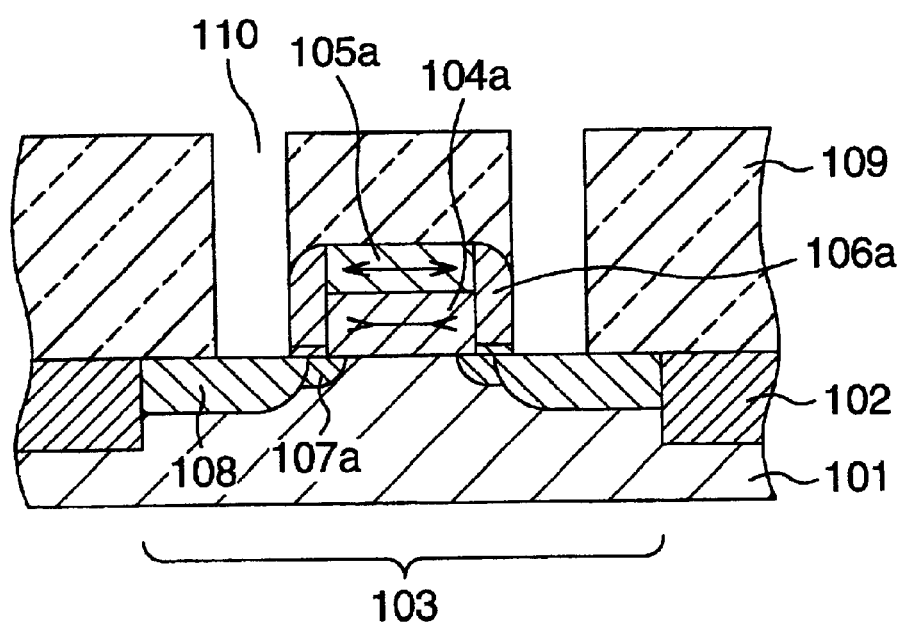
FIG. 10 is a schematic sectional view of the principal part of the semiconductor device according to Example 3 of the present invention.

The third embodiment of the present invention is described with reference to FIGS. 10, 11 and 12. FIG. 10 illustrates the structure in which the gate insulator is brought into a state of being compression strained, by for instance giving tensile strain to the gate electrode. When tensile strain is exerted to the gate electrode, its reaction brings the gate insulator into a state of being compression strained.

Figure 11A:
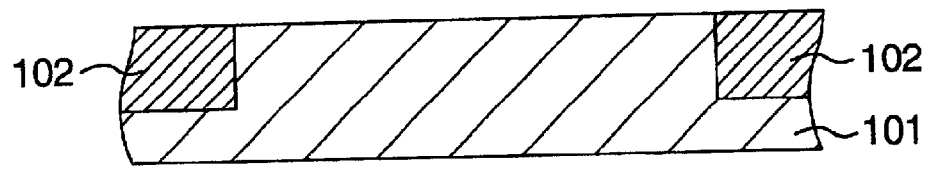
FIGS. 11A to 11D are a flow chart of the process for manufacturing the principal part of the semiconductor device shown in FIG. 10.
Figure 11B:
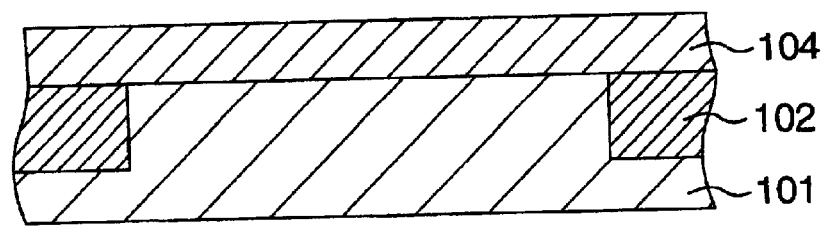
Figure 11C:
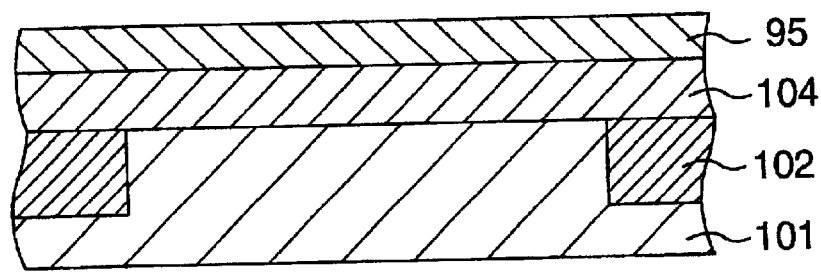
Figure 11D:
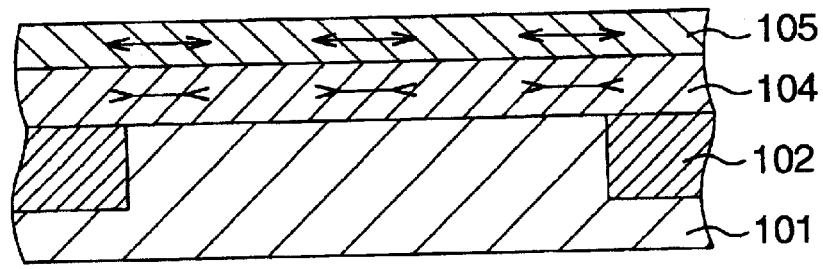
Figure 12A:
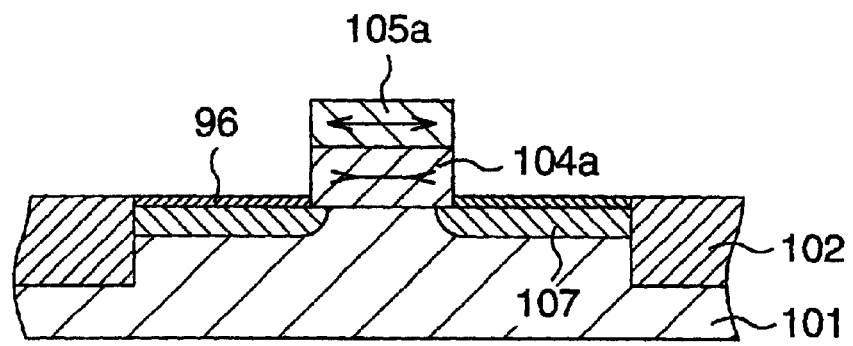
FIGS. 12A to 12C are another flow chart of the process for manufacturing the principal part of the semiconductor device shown in FIG. 10.
Figure 12B:
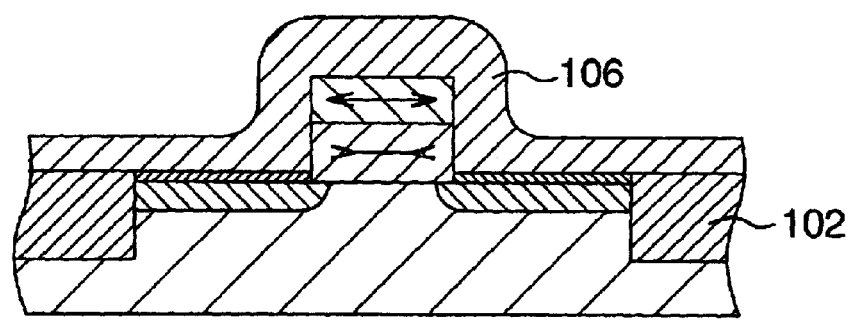

FIGS. 11 and 12 show a process for producing a semiconductor device having the tensile strained gate electrodes shown in FIG. 10 and the compression strained titanium oxide gate insulators. First, 200 to 300 nm deep grooves are formed in the surface of a P-type silicon substrate 101, and a silicon oxide film is embedded therein to form shallow-groove element separating layers 102 (FIG. 11A). Then, an approximately 30 nm thick rutile type titanium oxide film 104 is formed, by CVD for instance, on the surface of said silicon substrate 101 (FIG. 11B). In this operation, the film forming temperature is preferably set to be not lower than 660° C. If the film forming temperature is below 660° C., anatase type titanium oxide may be allowed to exist in the titanium oxide film 104 and it may be phase shifted into rutile type in the ensuing heat treatment. Phase shift of titanium oxide from anatase to rutile type is attended by a volume shrinkage, which may give rise to tensile strain in the titanium oxide film 104.

Next, an amorphous silicon film 95 containing impurity phosphorus (P) is formed on the surface of the rutile type titanium oxide film 104 by CVD. The thickness of this amorphous silicon film 95 is made about 200 nm for instance (FIG. 11C).

Further, the semiconductor substrate temperature is raised to 600° C. or above to crystallize the amorphous silicon film 95 to form a polycrystalline silicon film 105. Since crystallization of amorphous silicon is attended by volume shrinkage, the polycrystalline silicon film 105 formed by the crystallization is brought into a tensile strained state, and by the reaction of this tensile strain, the rutile type titanium oxide film 104 is turned into a compression strained state. Crystallization of the amorphous silicon film 95 may be effected by controlling the semiconductor substrate temperature, but laser irradiation may be employed (FIG. 11D).

Then, using a photoresist film as a mask, the polycrystalline silicon film 105 and rutile type titanium oxide film 104 are etched to form the gate insulators 104a and gate electrodes 105a of the MOS transistors, after which an approximately 2 nm thick silicon oxide film 96 is formed by thermal oxidation or CVD. Then an N⁻ type source/drain domain 107 of the MOS transistors is formed by ion implantation of phosphorus (P). This N⁻ type source/drain domain 107 is formed as self aligned to the gate electrodes and gate insulators. The purpose of forming the said silicon oxide film 96 is to minimize the damage to the silicon substrate by ion implantation of phosphorus (P).

Figure 12C:
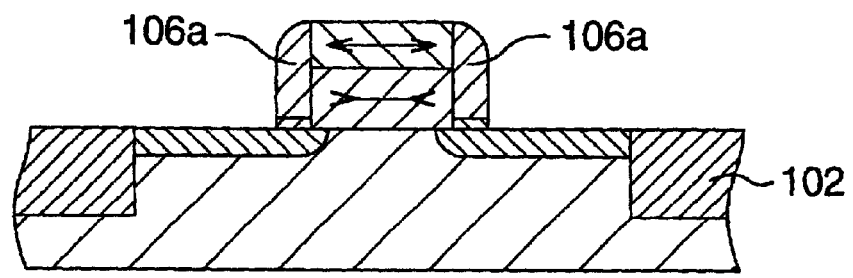

Then silicon nitride 106 is deposited on the semiconductor substrate surface to a thickness of 200 nm by sputtering or CVD (FIG. 12B) and the deposited silicon nitride film 106 and silicon oxide film 96 are etched to form side walls 106a of the gate electrodes and gate insulators (FIG. 12C).

Next, the element separating film 102, gate electrodes 106a and side walls 106a are masked and an N⁺ type source/drain diffusion layer 108 is formed by ion implantation of arsenic. Further, a layer insulating film 109 is formed by CVD, and in this insulating film are formed contact holes 110 which reach the surface of the diffusion layer.

Although the above-described production process concerns the case involving the N-channel MOS transistors, this process can be applied to the case where the P-channel MOS transistors are used. It can also be applied to the case of using CMOS transistors or BiCMOS transistors.

The gate electrode 105 may comprise, besides the polycrystalline silicon film mentioned above, a thin film of a metal such as tungsten and molybdenum, a metal compound such as tungsten nitride, or a metal silicide such as tungsten silicide, or a laminate thereof. Since no depletion is produced in the gate electrode film made of a metal such as tungsten or molybdenum, it is possible to reduce the effective thickness of the gate insulator. Also, tungsten is thermally stable and scarcely causes a change in film quality in the high-temperature processing after formation of the electrode film. In case the films are laminated with titanium oxide and tungsten contacting each other, there may be formed tungsten oxide. Tungsten oxide has lower permittivity than titanium oxide, and formation of such tungsten oxide leads to an increase of the reduced thickness of the gate insulator. It is therefore effective to use a tungsten nitride or tungsten silicide film having higher oxidation resistance than the tungsten film. Tungsten nitride especially excels in oxidation resistance. In case the tungsten nitride film is used for the gate electrode, it is advantageous to form a two-layer structure of gate electrode as shown in FIG. 4. By using tungsten nitride for the layer (105a in FIG. 4) contacting titanium oxide, and by composing the overlying layer (112 in FIG. 4) with tungsten which is lower in resistance than tungsten nitride, it is possible to obtain a low-resistance gate electrode.

In case of using the above materials for the gate electrode film, the gate insulator is brought into a compression strained state by controlling the film forming conditions. For example, in the case of the above-mentioned metals and metal compounds, a tensile strained state is produced by depositing them by sputtering at a film forming temperature of 300° C., and when a film of these metals or metal compounds is used for the gate electrode, the rutile type titanium oxide gate insulator is brought into a compression strained state by the force of reaction. Thus, the rutile type titanium oxide gate insulator assumes a compression strained state.

As explained above, the gate insulator 104a made of titanium oxide takes a compression strained state, and the bandgap thereof becomes greater than when the film has no strain or is in a state of being tensile strained.

Also, since the gate insulator 104a is composed of rutile type titanium oxide which is a high-permittivity material, it is possible to increase the physical thickness of the insulator as compared with the case where silicon oxide is used for the insulator, and to thereby prevent the DT current from flowing.

Further, because of use of rutile type titanium oxide for the gate insulator 104a, there can be obtained an insulator which is thermally more stable than when using anatase type titanium oxide for the gate insulator.

This makes it possible to lessen the probability of the electrons passing through the insulator, and to check the increase of leakage current.

Positive avoidance of the gate insulator 104a from being brought into a state of tensile strain is an expedient way for preventing increase of leakage current in the gate insulator 104a. For avoiding the gate insulator 104a from being turned into a tensile strained state, the crystal structure of titanium oxide used for the insulator is made rutile before formation of the insulating film. This is because according to the method in which titanium oxide of anatase type crystal structure is made into a film and then turned into rutile structure by phase transition, there may be produced a rutile structure retaining tensile strain. Since the density of anatase type titanium oxide is smaller than that of rutile type titanium oxide, anatase-to-rutile phase transition is attended by volume shrinkage, which involves the risk of generating tensile strain in the rutile type titanium oxide gate insulator.

A method for confirming the compression strained state of the titanium oxide gate insulator is to determine the interatomic distance between the titanium (Ti) atom and the oxygen (O) atom in titanium oxide by a transmission electron microscope (TEM). When no strain exists, the interatomic distance is 0.196 nm on the average. This indicates that when the average value of the interatomic distance is greater than 0.196 nm, the rutile type titanium oxide film will be in a tensile strained state, and when the average value of said distance is less than 0.196 nm, then said film will be in a compression strained state.

EXAMPLE 4

Figure 13:
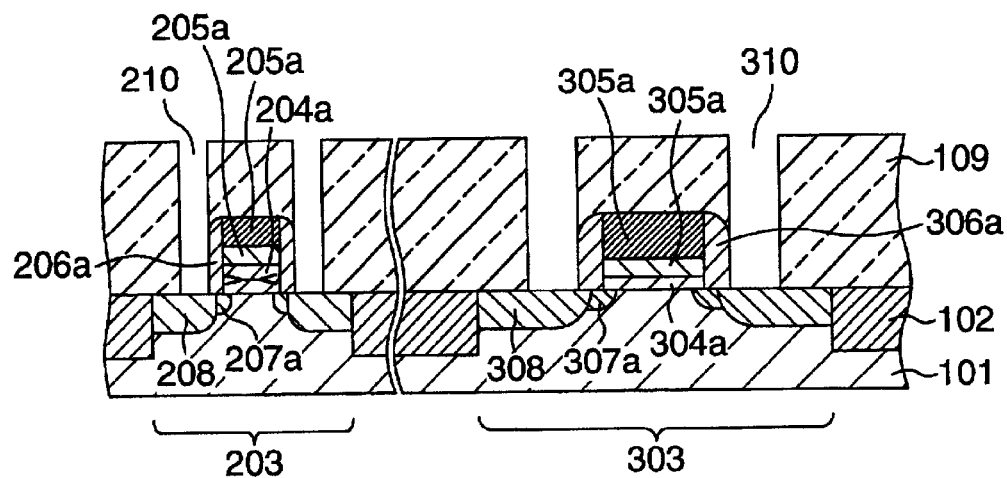
FIG. 13 is a schematic sectional view of the principal part of the semiconductor device according to Example 4 of the present invention, which view was taken along the line A–A' of FIG. 14.
Figure 14:
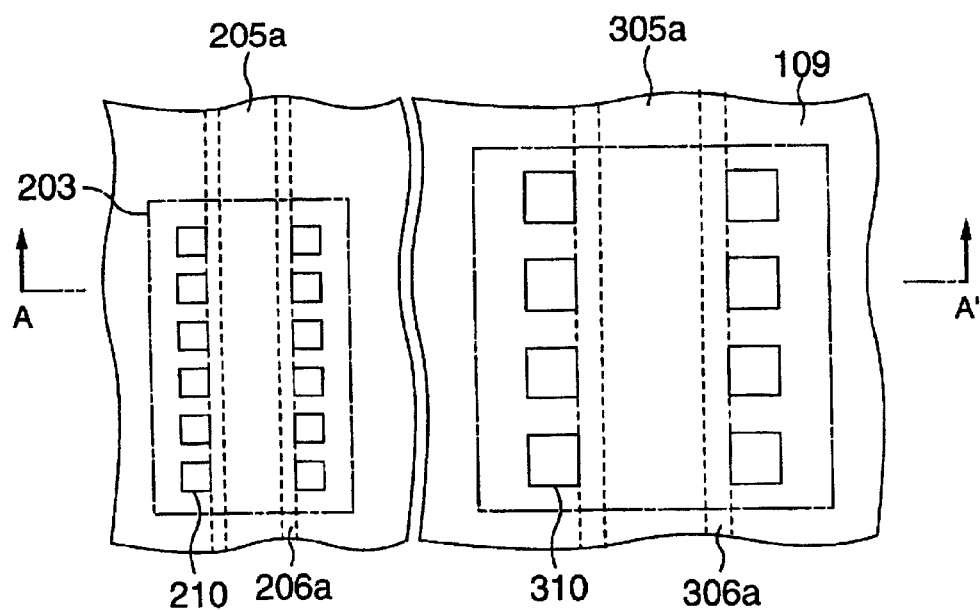
FIG. 14 is a top plan view of the principal part of the semiconductor device according to Example 4 of the present invention.

FIG. 13 is a schematic sectional view showing the structure of the principal part of the semiconductor device according to the fourth embodiment of the present invention, which view was taken along the line A–A' of FIG. 14 which shows a planar layout of the device.

The semiconductor device of the present invention has I/O circuits connected directly to the external devices and internal circuits which need not be connected to the external devices. These I/O circuits and internal circuits comprise single-channel MOS transistors, C-MOS transistors or BiC-MOS transistors. In this Example, for simplicity of the explanation, we merely refer to a semiconductor device which comprises only the N-channel MOS transistors having a source/drain diffusion layer of LDD structure.

In the semiconductor device of this embodiment, as shown in FIG. 13, an element separating film 102 made of, for example, silicon oxide is formed on the surface of a P-type silicon substrate 101. There are also provided an internal circuitry forming region 203 and an I/O circuitry forming region 303 in which the first N-channel MOS transistor and the second N-channel MOS transistor are formed respectively. The first MOS transistor formed in the internal circuitry forming region 203 has a gate insulator 204a and a gate electrode 205a. Gate electrode 205a is flanked by the side walls 206a which are made of, for example, silicon nitride. The main composing material of the gate insulator 204a is titanium oxide having a rutile type crystal structure. Gate electrode 205a comprises, for instance, a polycrystalline silicon film, a thin metal film, a metal silicide film, or a laminate thereof. In FIG. 13, the gate electrode 205a has a laminated structure, as one example.

The first MOS transistor has an $N^-$ type source/drain diffusion layer 207a formed as self-aligned to the gate electrode 205a and an $N^+$ type source/drain diffusion layer 208 self-aligned to the element separating layer 102 and gate electrode 205a.

When it is supposed that the thickness of said rutile type titanium oxide gate insulator is 30 nm and that the permittivities of rutile type titanium oxide and silicon oxide are 60 and 4.0, respectively, then the silicon oxide reduced thickness of said insulator is 2 nm, provided that they have the same dielectric properties. That is, the physical thickness of said insulator is 30 nm and its reduced thickness is 2 nm. Therefore, as the gate insulator 204a is composed of rutile type titanium oxide which is a high-permittivity material, it is possible to increase the physical thickness of the gate insulator as compared with the case where silicon oxide is used for the gate insulator 204a, and to thereby prevent the DT current from flowing.

The second MOS transistor formed in the L/O circuitry forming region 303 has a gate insulator 304a and a gate electrode 305a which is flanked by the side walls 306a made of, for example, silicon nitride. The gate insulator 304a comprises a silicon oxide film which is, for instance, 5 nm thick, or a laminate of a silicon oxide film of for instance 3 nm thickness and a 30 nm thick rutile type titanium oxide film. Supposing that the permittivities of rutile type titanium oxide and silicon oxide are 60 and 4.0, respectively, the silicon oxide reduced thickness of said laminate is 5 nm, provided that they have the same dielectric properties. Thus, the physical thickness of said insulator is 35 nm and its reduced thickness is 5 nm. As shown in FIG. 13, the gate electrode 305a has a laminated structure, as one example.

Each gate electrode 305a may comprise, for example, a polycrystalline silicon film, a thin metal film, a metal silicide film, or a laminate thereof. The second MOS transistor has an $N^-$ type source/drain diffusion layer 307a formed as self-aligned to the gate electrode 305a, and an $N^+$ type source/drain diffusion layer 308 formed as self-aligned to the element separating layer 102 and the gate electrode 305a.

In the above, the gate electrodes 205a and 305a have the laminated structure, but needless to say, these gate electrodes are not limited thereto and can take other structures.

A layer insulating film 109 is provided on the surface of this semiconductor device, and in this insulating film are formed contact holes 210, 310 which reach the $N^+$ type source/drain diffusion layers 208, 308, respectively.

In the first MOS transistor formed in the internal circuitry region, a high-permittivity film is used as the gate insulator like the MOS transistors shown in Example 1. Also, the gate length is shortened to, for example, 0.1 $\mu$m. Therefore, this transistor is suited for high-speed operation.

The MOS transistor for the I/O circuits is not so strongly required to have adaptability to high-speed operation as the MOS transistors of the internal circuits (e.g. circuits for calculation), and is rather required to be resistant to high voltage in the event of application of high voltage to the gate. Therefore, the second MOS transistor formed in the I/O circuitry region has a silicon oxide gate insulator 304a having a thickness of 3 nm or greater. A silicon oxide film of 3 nm or greater thickness is useful for reducing both of DT current and FN current. Thus, the second MOS transistor is resistant to high voltage applied between the gate electrode and the substrate and highly reliable in use as a transistor for I/O circuits.

According to this embodiment of the present invention, the MOS transistors suited for high-speed operation as an internal circuit element and the MOS transistors showing high resistance to high voltages as an I/O circuit element are both provided on the same substrate, so that it is possible to provide a semiconductor device with high reliability and low production cost.

The gate insulator 204a made of titanium oxide is preferably in a compression strained state. This makes it possible to increase the gate insulator bandgap as compared with the case where no strain exists or the film is tensile strained, as mentioned in Example 2, and consequently, it becomes possible to lessen the probability of the electrons being allowed to pass through the insulator, and to thereby check rise of leakage current.

A single or more layers of insulating film made of silicon oxide, silicon nitride, silicon oxide nitride or the like may be formed between the silicon substrate 101 and the gate insulator 204a. The thickness of such an insulating film, however, is preferably not greater than 0.5 nm for securing high permittivity of the gate insulator.

Also, the gate electrodes 205a, 305a may be formed in two or more layers as shown in FIG. 4.

Thus, according to the present invention, the gate insulator made of rutile type titanium oxide is in a compression strained state, and its bandgap is greater than provided when no strain exists or when the insulator is tensile strained. This contributes to lessening the probability of the electrons to pass through the insulator, making it possible to check the increase of FN leakage current and to provide a titanium oxide gate insulator structure which checks the flow of leakage current. It also becomes possible to provide the semiconductor devices with high reliability in a high yield.

EXAMPLE 5

The construction of the semiconductor device according to the fifth embodiment of the present invention and its production process are explained with reference to FIGS. 15 to 21.

Figure 15:
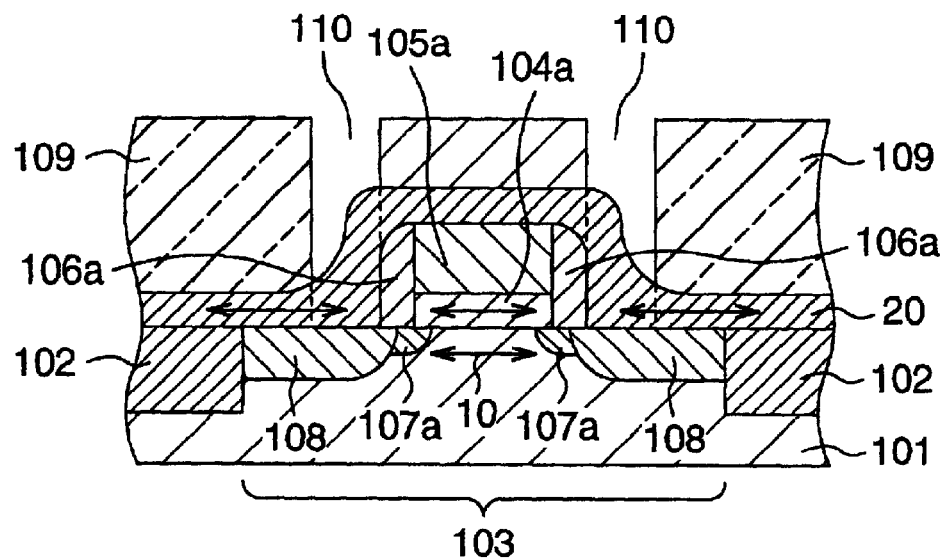
FIG. 15 is a schematic sectional view showing the sectional structure of the semiconductor device according to Example 5 of the present invention.
Figure 16:
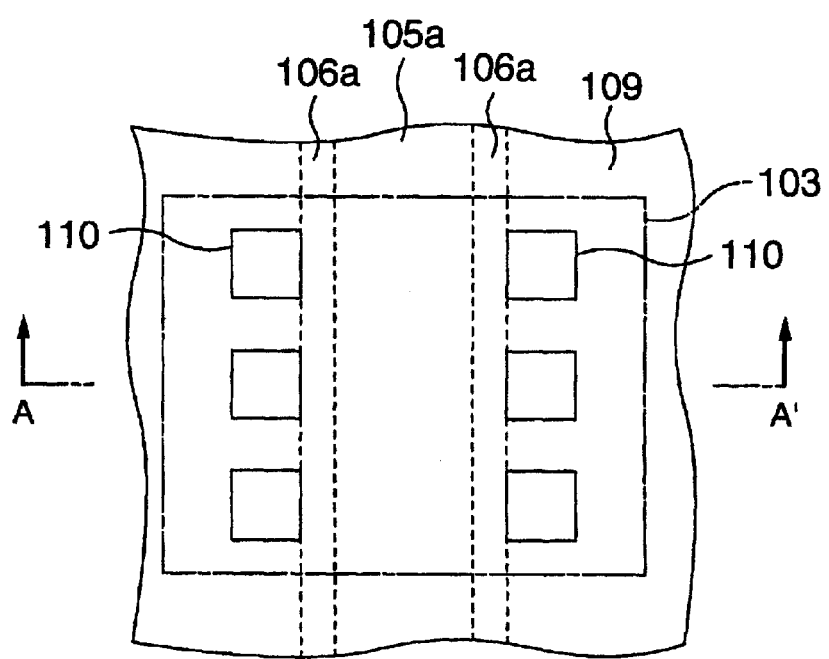
FIG. 16 is a planar layout of the principal part of the semiconductor device according to Example 5 of the present invention.

First, the construction of the semiconductor device according to this embodiment is described by referring to FIGS. 15 and 16.

FIG. 15 is a schematic sectional view showing, in section, the structure of the principal part of the semiconductor device according to Example 5 of the present invention, which view was taken along the line A–A' of FIG. 16 which shows a planer layout of the principal part of the semiconductor device of the instant embodiment.

In the semiconductor device according to this Example, as shown in FIG. 15, an element separating film 102 made of, for example, silicon oxide and an element forming region 103 are formed on the surface of a P-type silicon substrate 101, and N-channel MOS transistors are provided in said element forming region 103.

Each MOS transistor has a gate insulator 104a and a gate electrode 105a flanked by the side walls 106a made of, for example, silicon nitride. Said gate insulator 104a is mainly composed of titanium oxide having an anatase type crystal structure. The gate electrode 105a comprises, for instance, a polycrystalline silicon film, a thin metal film, a metal silicide film or a laminate thereof.

The MOS transistor has an N⁻ type source/drain diffusion layer 107a formed as self-aligned to the gate electrode 105a and an N⁺ type source/drain diffusion layer 108 formed as self-aligned to both of the element separating layer 102 and the gate electrode 105a.

A film 20 having tensile stress is formed on the surface of the MOS transistor. This tensile stressed film 20 is made of, for instance, silicon nitride. By this film 20, the channel region 10 of the silicon substrate is brought into a tensile strained state to lessen the effective mass of the carrier and realize speed-up of the device. The tensile stressed film 20 also produces tensile strain in the gate insulator.

A layer insulating film 109 is formed on the surface of this semiconductor device, and in said insulating film 109 are provided contact holes 110 which reach the N⁺ type source/drain diffusion layer 108.

The thickness of the anatase type titanium oxide gate insulator 104a is, for instance, 30 nm. Assuming that the permittivities of anatase type titanium oxide and silicon oxide are 60 and 4.0, respectively, then the silicon oxide reduced thickness of the gate insulator 104a is 2 nm, provided that they have the same dielectric properties. Namely, the physical thickness of the insulator is 30 nm and its reduced thickness (silicon oxide equivalent thickness) is 2 nm.

Thus, in the semiconductor device according to the instant embodiment of the present invention, the gate insulator 104a is composed of anatase type titanium oxide which is a high-permittivity material, so that it is possible to increase the physical thickness of the gate insulator 104a as compared with the case where the insulator is made of silicon oxide, and to thereby prevent the DT current from flowing.

Also, since titanium oxide whose main crystal structure is anatase type is used for the gate insulator, it is possible to make the insulator bandgap greater than provided when using rutile type titanium oxide. Further, even if tensile strain is given to the gate insulator, the anatase type bandgap is greater than the rutile type bandgap, so that it is possible to inhibit the rise of tunneling current due to tensile strain.

Figure 17:
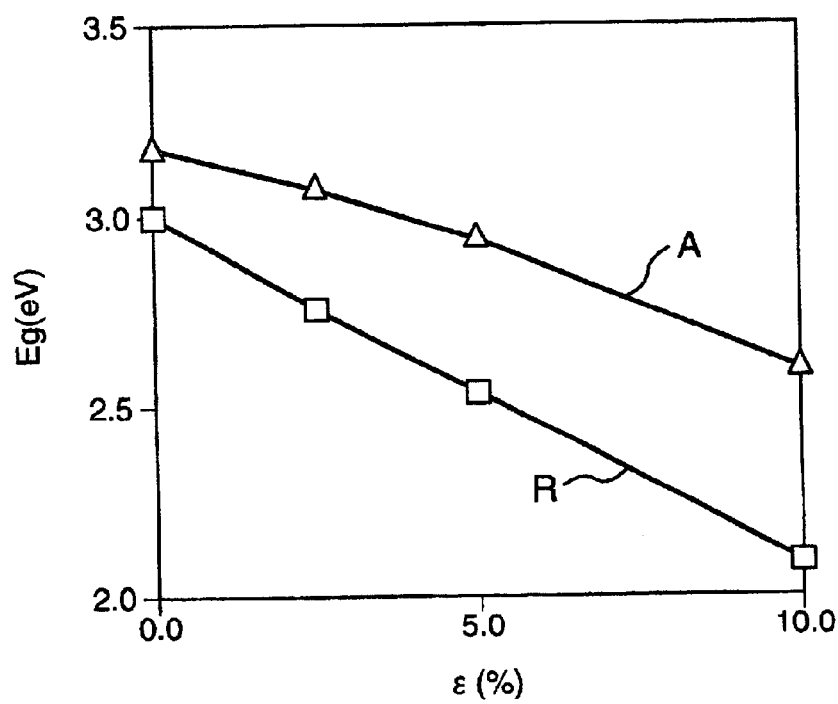
FIG. 17 is a graph illustrating tensile strain dependence of the bandgap of titanium oxide.
Figure 18:
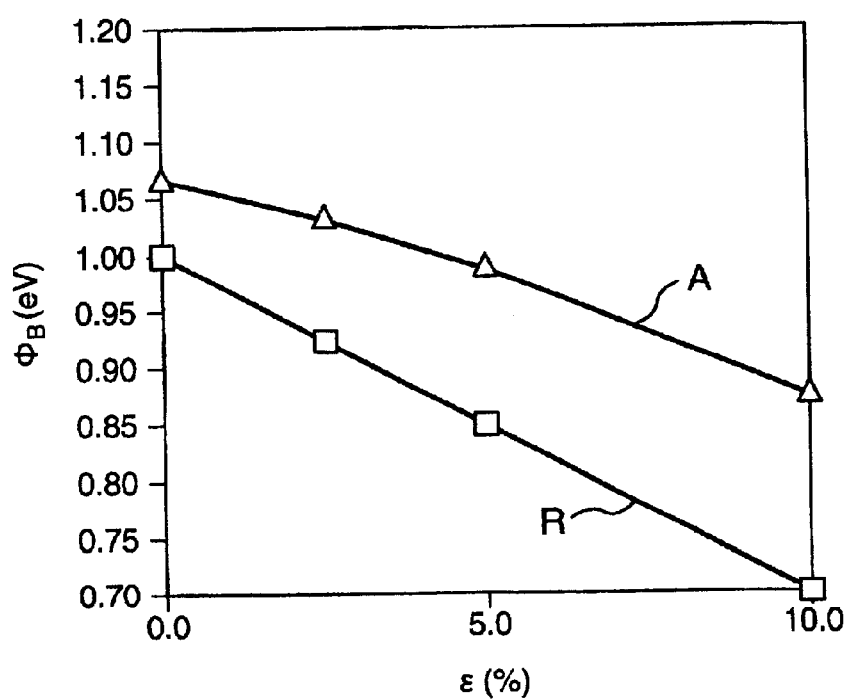
FIG. 18 is a graph illustrating tensile strain dependence of the barrier height of titanium oxide.
Figure 19:
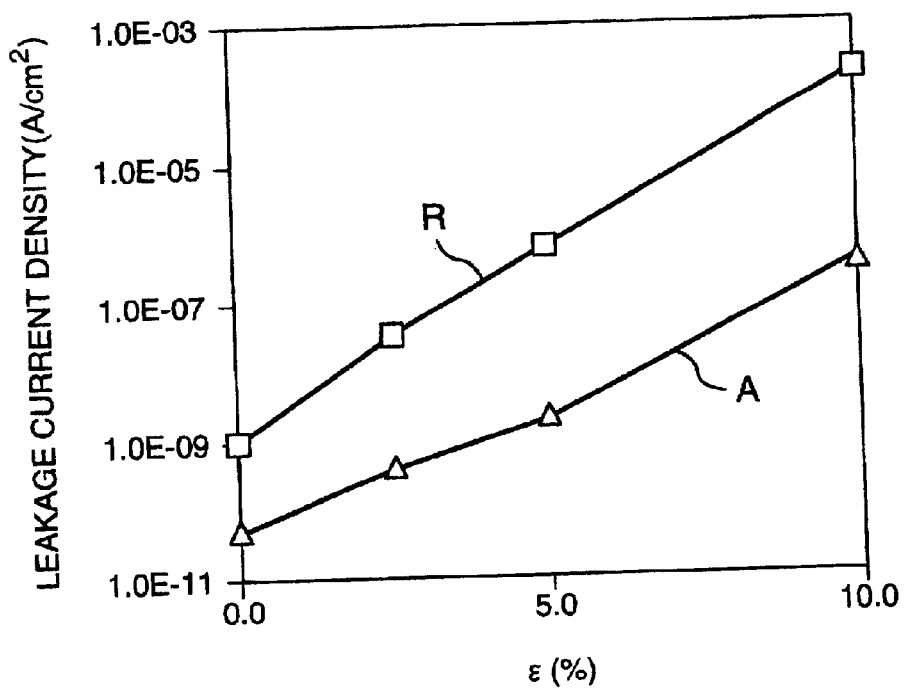
FIG. 19 is a graph illustrating tensile strain dependence of the leakage current density of barrier height of titanium oxide.

Here, tensile strain dependence of anatase type titanium oxide used for the semiconductor device in the instant embodiment of the present invention is discussed in comparison with the properties of rutile type titanium oxide by referring to FIGS. 17 to 19.

First, tensile strain dependence of the bandgap of titanium oxide is explained with reference to FIG. 17.

FIG. 17 is a graphic illustration of tensile strain dependence of the titanium oxide bandgap. In the graph, tensile strain ε (%) is plotted as abscissa and bandgap Eg (eV) as ordinate. Solid line A represents anatase type and solid line B represents rutile type.

As will be understood from FIG. 17, both of the bandgap $Eg^R$ (ε) of rutile type titanium oxide R and the bandgap $Eg^A$ of anatase type titanium oxide A decrease as strain is accumulated, but $Eg^A$ (ε) never becomes smaller than $Eg^R$ (ε).

Next, tensile strain dependence of barrier height of titanium oxide is explained with reference to FIG. 18.

FIG. 18 is a graphic illustration of tensile strain dependence of barrier height of titanium oxide. In the graph, tensile strain ε (%) is plotted as abscissa and barrier height $\Phi_B$ (eV) as ordinate. Positive strain indicates tensile strain and negative strain indicates compressive strain. Solid line A represents anatase type and solid line B represents rutile type.

Here, it was assumed that barrier height $\Phi_B^R$ (ε) was proportional to the bandgap Eg shown in FIG. 17, and barrier height of rutile type $\Phi_B^R$ (ε) was calculated from the following equation (1) while barrier height of anatase type $\Phi_B^A$ (ε) was calculated from the following equation (2).

$$\Phi_B^R(\epsilon)=\Phi_B^R(\epsilon=0)\times Eg^R(\epsilon)/Eg^R(\epsilon=0) \tag{1}$$

$$\Phi_B^A(\epsilon)=\Phi_B^A(\epsilon=0)\times Eg^A(\epsilon)/Eg^R(\epsilon=0) \tag{2}$$

Here, $\Phi_B^R$ (ε=0) is barrier height of rutile type when there existed no strain (ε=0), and it was supposed that $\Phi_B^R$ (ε=0)=1.0 eV. This value is barrier height of rutile type titanium oxide of the bulk obtained in the experiment.

It is desirable for making the calculations with higher precision to use the following equations (1') and (2') in place of the above-shown equations (1) and (2).

$$\Phi_B^R(\epsilon)=\frac{1}{2}(E_g^R(\epsilon)-E_g^{Si}) \tag{1'}$$

$$\Phi_B^A(\epsilon)=\frac{1}{2}(E_g^A(\epsilon)-E_g^{Si}) \tag{2'}$$

wherein $E_g^{Si}$ is bandgap of silicon and =1.1 eV.

As is seen from FIG. 18, barrier height of rutile type titanium oxide, $\Phi_B^R$ (ε), and barrier height of anatase type titanium oxide, $\Phi_B^A$ (ε), decrease as strain is accumulated, but $\Phi_B^R$ (ε) never becomes smaller than $\Phi_B^A$ (ε).

Next, tensile strain dependence of the leakage current density of titanium oxide is explained with reference to FIG. 19.

FIG. 19 is a graphic illustration of tensile strain dependence of the leakage current density of barrier height of titanium oxide. In the graph, tensile strain ε (%) is plotted as abscissa and leakage current density (A/cm²) as ordinate. Positive strain indicates tensile strain and negative strain indicates compressive strain. Solid line A represents anatase type and solid line R represents rutile type.

FIG. 19 shows the result when the applied voltage was 1 V and the silicon oxide equivalent thickness of the film was 2.0 nm. The silicon oxide equivalent thickness on the horizontal axis in FIG. 5 is the film thickness at which the same dielectric properties as silicon oxide can be obtained. When it is assumed that the permittivities of silicon oxide and rutile type titanium oxide are 4.0 and 60, respectively, then the titanium oxide film thickness whose silicon oxide equivalent thickness is 2.0 nm becomes 2.0 nm×60/4=30.0 nm.

It is seen from FIG. 19 that the leakage current densities of rutile type titanium oxide and anatase type titanium oxide rise up monotonously as the strain increases, but even if the strain is exerted, the leakage current density of anatase type titanium oxide remains smaller than that of rutile type titanium oxide. Thus, even if tensile strain is applied to the gate insulator as a result of impartation of tensile strain to the channel layer, it is possible to inhibit the rise of leakage current as compared with the case where rutile type is used, by using anatase type titanium oxide for the gate insulator. This leads to a reduction of power consumption of the device.

A method of producing the semiconductor device according to the instant Example is described with reference to FIGS. 20A to 20F which are a flow chart showing a process for producing the semiconductor device according to Example 5 of the present invention.

Figure 20A:
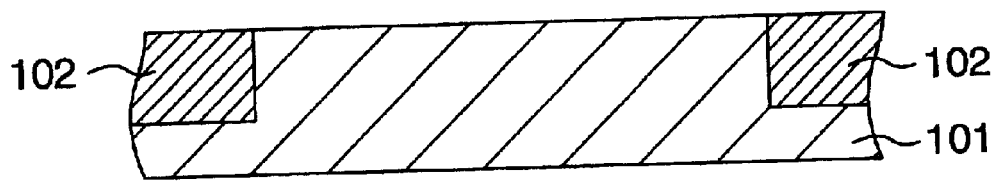
FIGS. 20A to 20F show a flow chart for producing the semiconductor device according to Example 5 of the present invention.

First, as shown in FIG. 20A, 200 to 300 nm deep grooves are formed in the surface of a P-type silicon substrate 101, and silicon oxide films are embedded therein to form shallow-groove element separating layers 102.

Figure 20B:
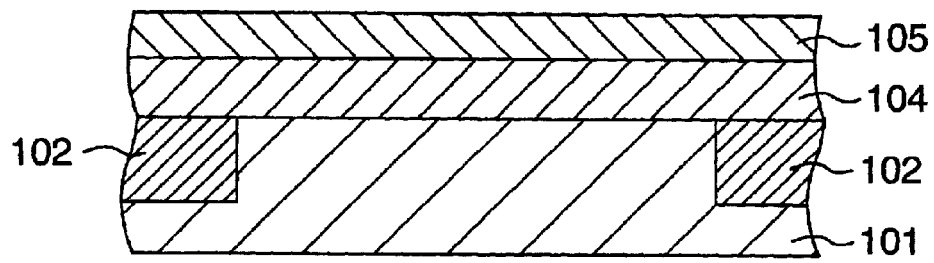

Next, as shown in FIG. 20B, an approximately 30 nm thick anatase type titanium oxide film 104 is formed on the surface of the silicon substrate 101 by CVD or other suitable method. In this operation, the film forming temperature should be not higher than 460° C., preferably not higher than 330° C. If the film forming temperature is over 460° C., there is a possibility that rutile type titanium oxide be mingled in the titanium oxide film 104 when it is formed. If the film forming temperature is below 330° C., it is likely that anatase to rutile phase transition would take place in the ensuing heat treatment at around 850° C. An $N^+$ type polycrystalline silicon film 105 with a thickness of about 200 nm is formed on the surface of the anatase type titanium oxide film 104 by CVD or other suitable means.

Figure 20C:
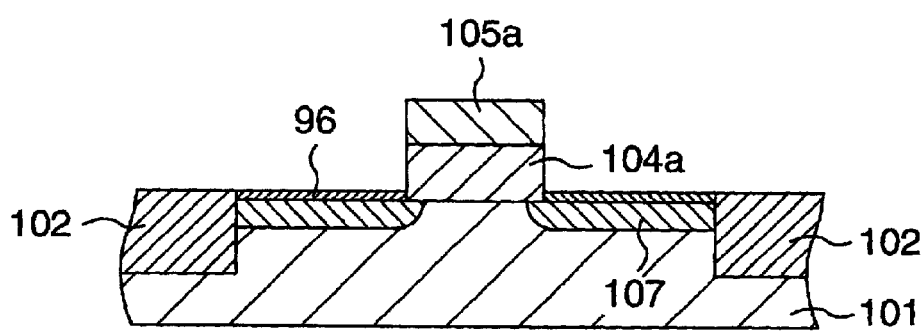

Then, as shown in FIG. 20C, the polycrystalline silicon film 105 and anatase type titanium oxide film 104 are etched through photoresist masking to form gate insulators 104a and gate electrodes 105a of the MOS transistors. This is followed by formation of an approximately 2 nm thick silicon oxide film 96 by thermal oxidation or CVD. An $N^-$ type source/drain region 107 of MOS transistor is formed by ion implantation of phosphorus. This $N^-$ type source/drain region 107 is designed as self-aligned to the gate electrodes and gate insulators. The purpose of forming the silicon oxide film 96 is to lessen the damage to the silicon substrate by ion implantation of phosphorus.

Figure 20D:
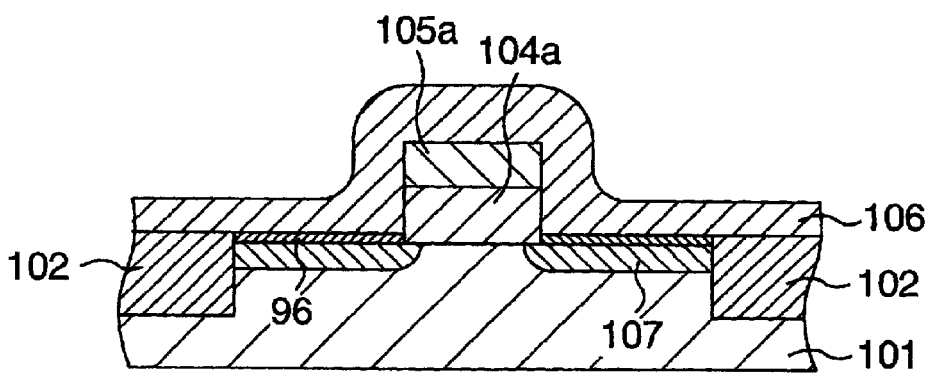

Then, as shown in FIG. 20D, a 200 nm thick silicon nitride film 106 is formed on the surface of the semiconductor substrate by sputtering or CVD.

Figure 20E:
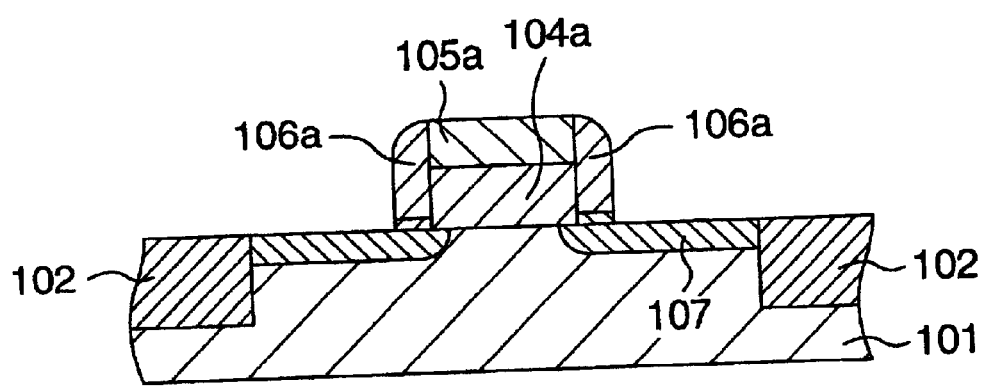

Further, as illustrated in FIG. 20E, the silicon nitride film 106 and silicon oxide film 96 are etched to form the side walls 106a flanking the gate electrodes and gate insulators.

Figure 20F:
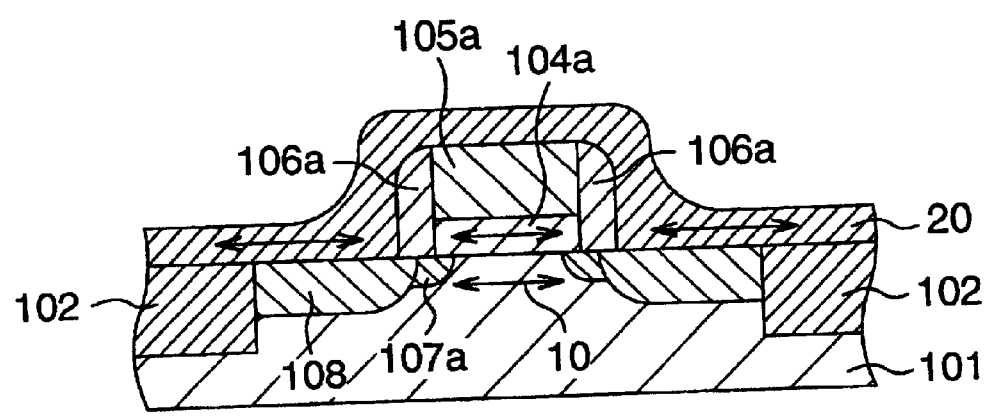

Finally, as shown in FIG. 20F, an $N^+$ type source/drain diffusion layer 108 is formed by ion implantation of arsenic through masking of element separating film 102, gate electrodes 105a and side walls 106a. Further, a 200 nm thick silicon nitride film 20 is deposited on the semiconductor substrate surface by CVD. This silicon nitride film formed by CVD produces a tensile stress, whereby the channel section 10 of the silicon substrate and the gate insulator 104a are also pulled and brought into a tensilely strained state. A layer insulating film 109 is formed by CVD, and in this insulating film are formed contact holes 110 which reach the surface of the diffusion layer. This completes formation of the principal part of the semiconductor device according to the instant embodiment shown in FIG. 15.

The above-described production process concerns adaptation of the N-channel MOS transistors, but this process can also be applied to the structures involving the P-channel MOS transistors, CMOS transistors or BiCMOS transistors.

The gate electrode 105a may comprise, besides a polycrystalline silicon film mentioned above, a thin film of a metal such as tungsten and molybdenum or a metal compound such as tungsten nitride and tungsten boride, a film of a metal silicide such as tungsten silicide, a luthenium oxide film, or a laminate thereof. Use of these materials is conducive to the reduction of resistance of the gate electrodes. In a structure where a ruthenium oxide film and a tungsten oxide insulating film are placed in contract with each other, an improvement of thermal stability of the titanium oxide gate insulator can be expected.

Since anatase type titanium oxide is thermally unstable in comparison with rutile type as mentioned above, there may take place anatase-to-rutile phase transition in annealing or other heat treatment after film formation. However, in this embodiment of the present invention which features anatase type main crystal structure of the titanium oxide gate insulator, even if the film contains several to around 10% of rutile type, such matter scarcely affects the effect of the instant embodiment of the invention and falls within the range of concept of the present invention.

As explained above, in the semiconductor device according to the present Example, since the channel region of the silicon substrate is in a tensilely strained state, the effective mass of the carrier electrons is reduced and a high-speed semiconductor device is realized.

Further, in this Example of the invention, since the main crystal structure of the titanium oxide gate insulator is anatase type, it is possible to make the bandgap of the gate insulator greater than available with the rutile type. Also, even if tensile strain is exerted to the gate insulator, the anatase type bandgap can be made greater than the rutile type bandgap. This makes it possible to check the rise of tunneling current due to tensile strain and to thereby lessen power consumption of the device.

Accordingly, reliability of the semiconductor device is enhanced and, as a result, its yield is elevated.

EXAMPLE 6

The structure of the semiconductor device according to the sixth embodiment of the present invention is explained with reference to FIG. 21.

Figure 21:
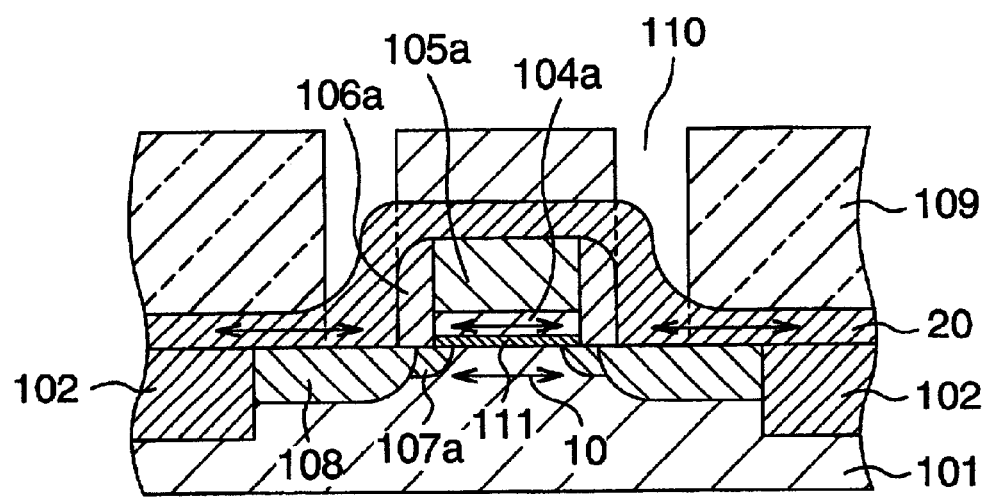
FIG. 21 is a schematic sectional view showing the sectional structure of the semiconductor device according to Example 6 of the present invention.

FIG. 21 is a schematic sectional view showing the structure of the principal part of the semiconductor device according to Example 6 of the present invention. The reference numerals used in the drawing correspond to those in FIG. 15.

In this embodiment, as shown in FIG. 21, an insulating film made of, for instance, silicon oxide, silicon nitride or silicon oxide nitride, or a titanium silicate film 111 is formed in single or more layers between the silicon substrate 101 and the titanium oxide gate insulator 104a. The thickness of such an insulating film 111 is preferably not greater than 0.5 nm for providing the desired dielectric properties of the gate insulator. The presence of said film between the silicon substrate 101 and the titanium oxide gate insulator is conducive to the improvement of thermal stability of the titanium oxide gate insulator.

It is possible with this embodiment, too, to realize speed-up and a reduction of power consumption of the semiconductor device. It is also possible to enhance reliability of the device and, consequently, to raise the yield.

EXAMPLE 7

The structure of the semiconductor device according to the seventh embodiment of the present invention is described with reference to FIG. 22.

Figure 22:
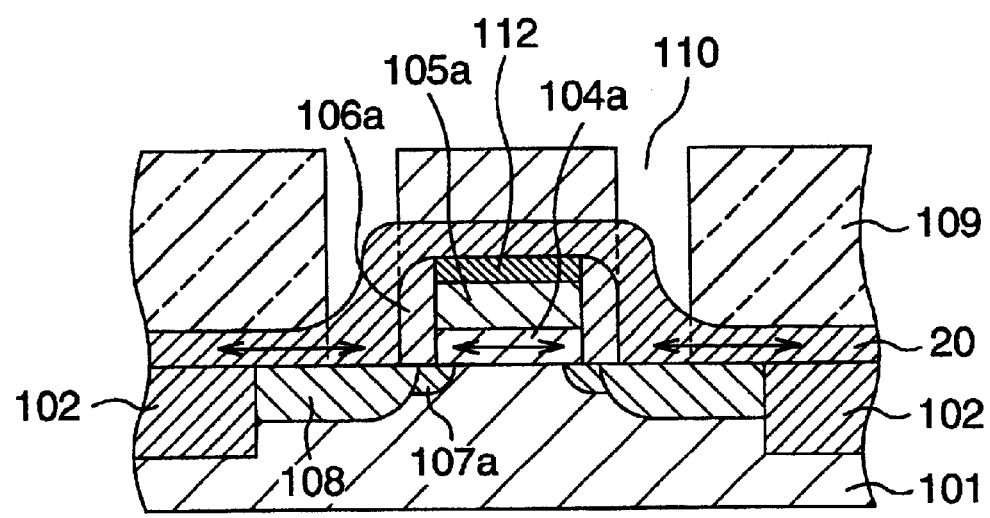
FIG. 22 is a schematic sectional view showing the sectional structure of the semiconductor device according to Example 7 of the present invention.

FIG. 22 is a schematic sectional view showing the structure of the principal part of the semiconductor device according to Example 7 of the present invention. The reference numerals in the drawing correspond to those used in FIG. 15.

In this embodiment, as shown in the drawing, the gate electrode is composed of the films 105a and 112 in two or more layers. The film 112 may be made of a silicide, the same material as used for the film 105a, aluminum (Al), tungsten (W) or the like.

This embodiment, too, is capable of realizing speed-up and a reduction of power consumption of the semiconductor device. Accordingly, reliability of the semiconductor device is enhanced and its yield is raised.

It will be further understood by those skilled in the art that the foregoing description has been made on embodiments of the invention and that various changes and modifications may be made in the invention without departing from the spirit of the invention and the scope of the appended claims.

What is claimed is:

1. A semiconductor device equipped with MOS transistors having titanium oxide gate insulators interposed between a semiconductor substrate and gate electrodes, wherein the state of strain of the channel region of said semiconductor substrate is tensile strain, and the main crystal structure of said titanium oxide is anatase to inhibit a rise in tunneling current caused by said tensile strain.

2. A semiconductor device according to claim 1, wherein a silicon oxide film or a titanium silicate film is disposed between said semiconductor substrate and said titanium oxide gate insulators.

3. A semiconductor device according to claim 1, wherein said gate electrodes have a phosphorus-or boron-added polycrystalline silicon film, and a silicon oxide film or a titanium silicate film is interposed between said gate electrodes and said titanium oxide gate insulators.

4. A semiconductor device according to claim 1, wherein said gate electrodes comprise a tungsten film, a molybdenum film, a tungsten nitride film, a tungsten boride film, a tungsten suicide film, or a laminate thereof.

5. A semiconductor device according to claim 1, wherein said gate electrodes comprise a ruthenium oxide film which is in contact with said titanium oxide gate insulator.

6. A semiconductor device comprising:

a semiconductor substrate;

gate insulators formed on said substrate, and gate electrodes formed on said gate insulators, wherein said gate insulators are comprised of a material as a main component selected from titanium oxide, zirconium oxide and hafnium oxide in which compression strain is produced so that interatomic distances in the material are decreased to suppress leakage current from flowing through the gate insulators, and said semiconductor device is equipped with MOS transistors.

7. A semiconductor device comprising:

a semiconductor substrate, gate insulators formed on said substrate, and gate electrodes formed on said gate insulators, wherein said gate insulators are comprised of titanium oxide as a main component having a rutile crystal structure in which compression strain is produced so that interatomic distances in said titanium oxide are decreased to suppress leakage current from flowing through the gate insulators, and said semiconductor device is equipped with MOS transistors.

8. A semiconductor device comprising:

a semiconductor substrate, gate insulators formed on said substrate, and gate electrodes formed on said gate insulators, said gate insulators being comprised of titanium oxide as a main component having a rutile crystal structure, and said semiconductor device being equipped with MOS transistors, wherein the thermal expansion coefficient of the main component material of said gate electrodes is greater than the linear expansion coefficient of said titanium oxide.

9. A semiconductor device comprising:

a semiconductor substrate;

gate insulators formed on said substrate, and gate electrodes formed on said gate insulators, wherein said gate insulators are comprised of titanium oxide as a main component having a rutile crystal structure in which compression strain is produced so that interatomic distances in said titanium oxide are decreased to suppress leakage current from flowing through the gate insulators while tensile strain is produced in the gate electrode, and said semiconductor device is equipped with MOS transistors.

10. A semiconductor device according to claim 6, wherein said insulator includes a film comprised of silicon oxide as a main component and an overlying film comprised of a material as a main component selected from titanium oxide, zirconium oxide and hafnium oxide.

11. A semiconductor device comprising:

a semiconductor substrate, and

MOS transistors formed on said substrate and each having a gate insulator and a gate electrode formed on said gate insulator, wherein a first MOS transistor has a gate insulator comprised of a high permittivity material as a main component selected from titanium oxide, zirconium oxide and hafnium oxide to permit high speed operation, and a second MOS transistor has a gate insulator containing silicon oxide as a main component to resist high gate voltages.

12. A semiconductor device according to claim 11, wherein the first MOS transistor is a transistor used for logic or memory circuits, and the second MOS transistor is a transistor used for I/O.

13. A semiconductor device comprising:

a semiconductor substrate, gate insulators formed on said substrate, and gate electrodes formed on said gate insulators, wherein said gate insulators have a multilayered structure comprised of a material as a main component selected from titanium oxide, zirconium oxide and hafnium oxide and in which compression strain is produced so that interatomic distances in the material are decreased to suppress leakage current from flowing through the gate insulators, and said semiconductor device is equipped with MOS transistors.

14. A semiconductor device including MOS transistors comprising:

a semiconductor substrate;

gate insulators formed on said substrate, gate electrodes formed on said gate insulators, wherein said gate insulators are comprised of a material as a main component selected from titanium oxide, zirconium oxide and hafnium oxide, and wherein interatomic distances in the material are decreased to suppress leakage current from flowing through the gate insulator.

15. A semiconductor device according to claim 14, wherein said interatomic distances are decreased between the titanium, zirconium or hafnium atoms and the oxygen atoms in the oxide.

16. A semiconductor device according to claim 14, wherein said interatomic distances are decreased by producing a compression strain in said gate insulators.

17. A semiconductor device according to claim 15, wherein said interatomic distances are decreased by producing a compression strain in said gate insulators.

18. A semiconductor device according to claim 14, wherein said gate insulators are comprised of titanium oxide as the main component having a rutile crystal structure.

19. A semiconductor device according to claim 15, wherein said gate insulators are comprised of titanium oxide as the main component having a rutile crystal structure.

20. A semiconductor device according to claim 16, wherein said gate insulators are comprised of titanium oxide as the main component having a rutile crystal structure.

21. A semiconductor device according to claim 17, wherein said gate insulators are comprised of titanium oxide as the main component having a rutile crystal structure.

22. A semiconductor device according to claim 14, wherein a tensile stress is produced in said gate electrode.

23. A semiconductor device according to claim 15, wherein a tensile stress is produced in said gate electrode.

24. A semiconductor device according to claim 16, wherein a tensile stress is produced in said gate electrode.

25. A semiconductor device according to claim 17, wherein a tensile stress is produced in said gate electrode.

26. A semiconductor device according to claim 18, wherein a tensile stress in said gate electrode.

* * * * *